United States Patent [19]

Turck

[11] Patent Number: 4,755,637

[45] Date of Patent: Jul. 5, 1988

[54] PROXIMITY SWITCH FOR DETECTING A PISTON POSITION IN A PRESSURE CYLINDER

[75] Inventor: Werner Turck, Halver, Fed. Rep. of Germany

[73] Assignee: Werner Turck GmbH & Co. KG, Halver, Fed. Rep. of Germany

[21] Appl. No.: 103,031

[22] Filed: Sep. 30, 1987

[30] Foreign Application Priority Data

Sep. 30, 1986 [DE] Fed. Rep. of Germany ... 8626017[U]

[51] Int. Cl.⁴ ............................................ H01H 35/38
[52] U.S. Cl. ................................ 200/82 R; 200/82 C
[58] Field of Search ....................... 73/861.44, 745; 340/626; 91/1; 92/5 R; 307/118; 361/178, 179; 200/47, 81 R, 82 R, 82 C, 81.9 R, 81.9 M

[56] References Cited

U.S. PATENT DOCUMENTS 3,414,693 12/1968 Watson .............................. 200/82 R
4,413,549 11/1983 Knable .............................. 200/82 C
4,697,643 10/1987 Sassier ................................ 340/626

Primary Examiner—G. P. Tolin
Attorney, Agent, or Firm—Antonelli, Terry & Wands

[57] ABSTRACT

A proximity switch adapted to be threaded into a pressure cylinder, with the proximity switch including a sensor part insertable into a bore or opening of a cylinder wall of the pressure cylinder for detecting a position of the piston. A housing of the proximity switch includes a metal casing for accommodating a sensor part of the proximity switch, a front cap for sealing the metal casing, an a housing section attached to the metal casing and including a cable connection portion. A continuously extending output collar is provided at a rear end of the metal casing, with the collar being adapted to be fixedly clamped against the cylinder wall by a mounting gland extending behind a rear face thereof or by a coupling ring.

11 Claims, 2 Drawing Sheets

PROXIMITY SWITCH FOR DETECTING A PISTON POSITION IN A PRESSURE CYLINDER

BACKGROUND OF THE INVENTION

The present invention relates to a detection means and, more particularly, to a proximity switch adapted to be threaded into a pressure cylinder wall, with the switch including a sensor portion insertable into a bore or perforation provided in the cylinder wall, with the sensor portion detecting a position of the piston.

It has been proposed to provide a proximity switch of the aforementioned type with a synthetic resin housing; however, under practical conditions, considerable problems and disadvantages are encountered in connection with a sealing of the bore or perforation in the cylinder wall.

Moreover, in the proposed proximity switches, problems arise due to the frequently extremely high pressure within the cylinder which can lead to an improper deformation or, in extreme cases even to a blasting away of the entire proximity switch from the pressure cylinder.

Furthermore, the proposed proximity switches do not lend themselves to alignment during sassembly in each case and, consequently, the connecting cables of the proximity switches, which are generally lead or extend laterally away from the proximity switches, cannot be oriented into a position optimally adapted to a respective installation situation.

The aim underlying the present invention essentially resides in providing a proximity switch of the aforementioned type which is capable of withstanding a high pressure load, forming a secure seal, and is readily adapted to be rotationally aligned during assembly in an infinitely variable fashion in the cylinder wall about a longitudinal axis of the bore or perforation in the cylinder wall.

In accordance with advantageous features of the present invention, a housing of the proximity switch includes a metal casing means for accommodating a sensor part of the proximity switch, with a front cap means being provided for sealing the metal casing. A separate housing section is attached to the metal casing and includes the cable connection means. The metal casing has a continuously extending outer collar at a rear end thereof, with the collar being adapted to be fixedly clamped against the cylinder wall by a mounting gland means extending behind a rear face of the collar or by a coupling ring.

By virtue of the above noted features of the present invention, the sensor part of the proximity switch and the metal casing surrounding the sensor part can be made of a very small diameter so that only a correspondingly small opening or bore in the cylinder wall is required and an end face of the sensor part, exposed to the pressure, is also of a small dimension. Consequently, the pressure load on the sensor part is considerably reduced by virtue of the features of the present invention.

Since the outer collar of the casing lying outside of the perforation can be constructed with a small wall thickness in accordance with the present invention, as well as with a large diameter, the collar can withstand maximum compressive forces and, respectively, tensile forces. The externally located housing section is no longer subjected to compressive or tensile stresses by virtue of the present invention so that the mounting means between the casing and the external housing section poses no particular problems.

In accordance with additional further features of the present invention, the casing includes a rearward extension provided with an external thread adapted to receive the threadable portion of the housing section so as to enable the housing section to be threaded thereon. With such an arrangement, the outer collar of the casing and the housing section form between them a continuously extending external groove space wherein the mounting gland and/or the coupling ring is held in a loosely rotatable fashion.

In the industrial manufacturing of the proximity switch, the casing and the housing section are threaded together holding the mounting gland or coupling ring therebetween the free interspaces thereof are filled with a castable synthetic resin. During the step of mounting the proximity switch to the pressure cylinder, the metal casing is pushed into the opening or bore of the cylinder wall and, thereafter, the gland is initially loosely threaded in the prepared mounting bores of the pressure cylinder and, after a final rotary alignment of the proximity switch, it is fixedly clamped against the cylinder in the final step.

Advantageously, in accordance with the present invention, an outer collar of the casing and the housing section form therebetween a continuously extending external groove means for accommodating the mounting gland and or a coupling ring held therein in a loosely rotatable fashion.

A front cap of the metal casing accommodating the sensor part, advantageously is formed of one of a synthetic resin or a ceramic material.

Preferably, an annular groove with an O-ring inserted therein is provided in the front face of the outer collar and, advantageously, the sensor part has a mushroom-shaped core with a base in contact with the front cap, and with the mushroom-shaped core resting at a rearward portion thereof by way of a bushing on an inner shoulder of the metal casing.

Advantageously, in accordance with the present invention, the bushing includes a peripheral groove having an O-ring inserted therein which is adapted to be pressed against the metal casing, and a tubular projection surrounds the head of the mushroom-shaped core, with the front cap being inserted, with a rearward rim section, between the metal casing and the projection.

Advantageously, one locking shoulder or locking seat cooperating as a snap or click-stop connection is arranged at the rim section and at the projection of the bushing, respectively.

The above and other objects, features, and advantages of the present invention will become more apparent from the following description when taken in connection with the accompanying drawings which show, for the purposes of illustration only, one embodiment in accordance with the present invention.

DETAILED DESCRIPTION

Figure 1:
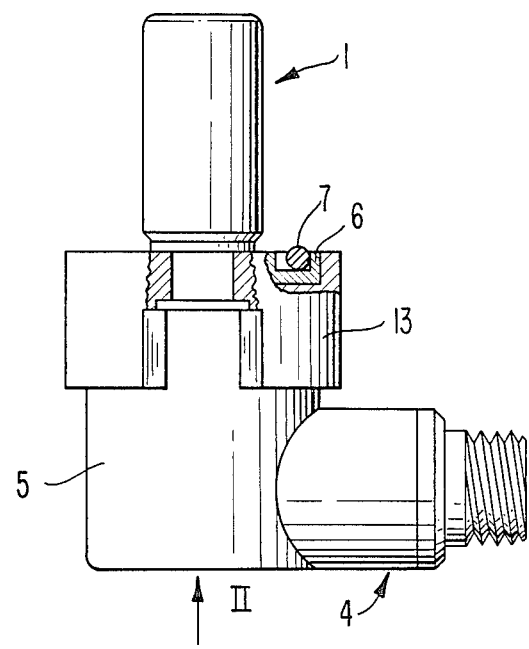
FIG. 1 is a partial cross-sectional view of a proximity switch constructed in accordance with the present invention.
Figure 3:
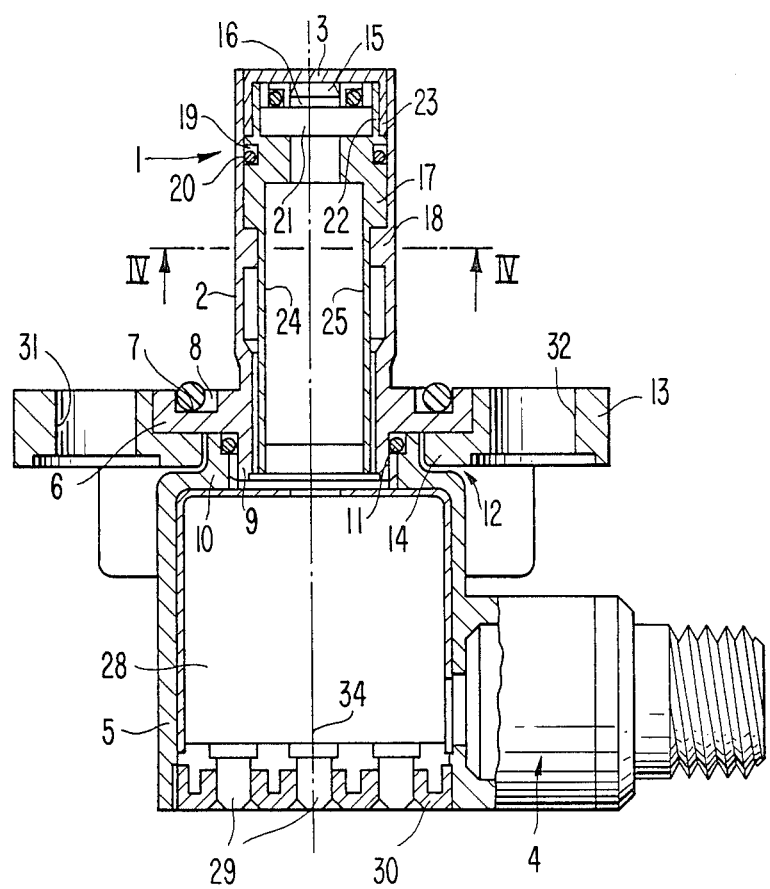
FIG. 3 is a longitudinal cross-sectional view, on an enlarged scale, of the proximity switch of FIG. 1.

Referring now to the drawings wherein like reference numerals are used throughout the various views to designate like parts and, more particularly, to FIGS. 1 and 3, according to these figures, a proximity switch includes a metal casing 2 accommodating a sensor part generally designated by the reference numeral 1, a front cap 3 of a synthetic resin, for sealing off the metal casing 2 in a forward direction thereof, and a housing section 5 provided with a cable connection part generally designated by the reference numeral 4. A rear end of the metal casing 2 has a thickness of, for example, 0.5–0.5 mm and includes a comparatively large-size and thick-walled outer collar 6, with a forward face of the collar 6 including an annular groove 8 for accommodating an O-ring 7. The casing 2 also includes a rearward extension portion 9 having an external thread, and the housing part 5 includes a recessed neck 10 adapted to be threaded on the external thread of the rearward extension 9 while simultaneously clamping an O-ring 11 in place. The external collar of the metal casing 2 and the housing section 5 encompass therebetween a continuously extending external groove space 12 wherein a mounting gland 13 is held with an internal rim 14 thereof in a loosely rotatable fashion.

As shown most clearly in FIG. 3, the sensor part 1 has a substantially mushroom-shaped core 16 having a base 15 in contact with the front cap 3. A bushing 17 supports a rear portion of the core 16 on an inner shoulder 18 of the metal casing 2. An additional O-ring 20 is located in a peripheral groove 19 of the bushing 17, with the O-ring being in firm contact with the metal casing 2. The bushing 17 has at a front end thereof a tubular projection 22 surrounding the head 21 of the core 16. The front cap 3 is inserted, with a rearward rim section 23, between the metal casing 2 and the projection 22. One continuously extending locking shoulder or locking seat is arranged for cooperation as a snap or click-stop connection at the rim section 23 and at the projection 22 of the bushing 17, respectively.

Figure 4:
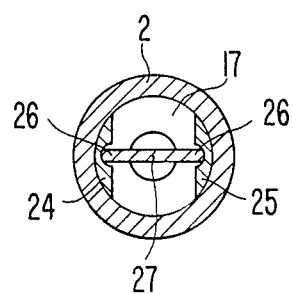
FIG. 4 is a cross-sectional view taken along the line IV—IV in FIG. 3.

Two parallel arms 24, 25, disposed in diametrical opposition to each other, are disposed at a rear end of the bushing 17, with each of the arms 24, 25 including a longitudinal groove 26 on an inside thereof. A printed circuit board 27 (FIG. 4) is inserted in the longitudinal groove 26, with the printed circuit board 27 carrying electronic components of the sensor part 1 such as, for example, an oscillator, of conventional construction.

Figure 2:
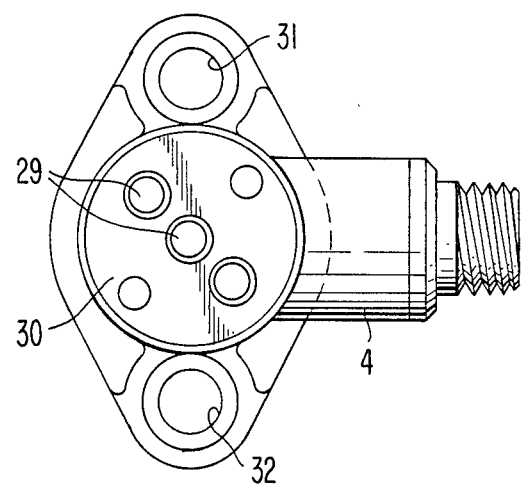
FIG. 2 is a top view of the proximity switch of the present invention taken in the direction of arrow II in FIG. 1.

A further printed circuit board 28 (FIG. 3) is arranged in the housing section 5 and carries electronic components of, for example, an amplifier stage and an evaluating stage, both of conventional construction, as well as, for example, connections for several light emitting diodes 29 (FIGS. 2, 3).

The entire housing, after the electronic elements have been installed, is filled with a castable synthetic resin and is then sealed with a lid 30. As a result, an element is obtained thereby which is totally rigid, with the gland 13 being retained therein in a loosely rotatable fashion. During assembly, the sensor part is inserted in a fitted bore or perforation of the pressure medium cylinder, and thereafter the mounting gland 13, provided with two mounting bores 31, 32 is initially loosely threaded to the prepared mounting bores in the cylinder wall, whereafter the proximity switch is then turned about the longitudinal axis 34 into a position wherein the laterally projecting cable connection part 4 is aligned into a position optimal for the respective installation conditions. Subsequently, the mounting screws of the mounting gland 13 are tightened, whereby then the O-ring 7 effects a flawless seal between the cylinder wall and the outer collar 6.

I claim:

1. A proximity switch threaded into a pressure cylinder wall, the proximity switch including a sensor means inserted in an opening of the cylinder wall of the pressure cylinder for detecting a position of a piston in the pressure cylinder, wherein the proximity switch includes a metal casing means accommodating the sensor means, a front cap means sealing the metal casing means, and a housing section attached to the metal casing means including cable connections means, said metal casing means including a continuously extending outer collar means at a rearward end thereof fixedly clamped against the cylinder wall, and wherein a mounting gland means is disposed behind a rear face of the outer collar means which creates a sealed coupling between the metal casing means and the cylinder wall, wherein a continuously extending groove means is provided between said outer collar means and said housing section and accommodates said mounting gland in a loosely rotatable manner.

2. A proximity switch according to claim 1, wherein the metal casing means includes a rearward extension means provided with an external thread portion, and wherein the housing section includes a corresponding threaded portion so that the housing section is threadably secured to the metal casing means.

3. A proximity switch according to claim 1, wherein said front cap means is formed of at least one of a synthetic resin and a ceramic material.

4. A proximity switch according to claim 1, wherein an annular groove means is provided in a front face of the outer collar means and accommodates an O-ring means.

5. A proximity switch according to claim 3, wherein the sensor means has a substantially mushroom-shaped core means having a base in contact with the front cap means and a rear portion supported by a bushing means on an inner shoulder means of the metal casing means.

6. A proximity switch according to claim 5, wherein the bushing means includes a peripheral groove means which accommodates an O-ring and is pressed against the metal casing means.

7. A proximity switch according to claim 6, wherein said bushing means includes a tubular projection means surrounding a head of the mushroom-shaped core means of the proximity switch; and wherein the front cap means includes a rearward rim section inserted between the metal casing means and the projection means.

8. A proximity switch according to claim 7, wherein one of a locking shoulder and locking seat is respectively arranged at the rearward rim section and at the projection means of the bushing means for cooperation so as to form one of a snap and click-stop connection.

9. A proximity switch according to claim 8, wherein the bushing means includes, at a rearward end thereof, two parallel arms lying at mutually diametrical opposition to each other, each of said parallel arms having on an inside thereof one longitudinal groove means for enabling an insertion of a printed circuit board.

10. A proximity switch according to claim 1, wherein the cable connection means of the housing section projects laterally in a direction substantially perpendicular to a longitudinal axis of the proximity switch.

11. A proximity switch according to claim 1, wherein said front cap means is formed of at least one of a synthetic resin and a ceramic material.

* * * * *